(12) United States Patent
Hsu et al.

(10) Patent No.: US 9,118,287 B2
(45) Date of Patent: *Aug. 25, 2015

(54) ADAPTIVE AMPLIFICATION CIRCUIT

(71) Applicant: NOVATEK Microelectronics Corp., Hsin-Chu (TW)

(72) Inventors: Xie-Ren Hsu, Hsinchu (TW); Chia-Hung Lin, Hsinchu (TW); Wei-Hsiang Hung, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/970,618

(22) Filed: Aug. 20, 2013

(65) Prior Publication Data

US 2013/0328631 A1 Dec. 12, 2013

Related U.S. Application Data

(63) Continuation of application No. 13/196,873, filed on Aug. 2, 2011, now Pat. No. 8,542,063.

(30) Foreign Application Priority Data

Dec. 10, 2010 (TW) .............................. 99143270 A (51) Int. Cl.
*H03F 3/45* (2006.01)
*H03F 1/02* (2006.01)

(52) U.S. Cl.
CPC .......... *H03F 3/45076* (2013.01); *H03F 1/0261* (2013.01); *H03F 3/45632* (2013.01); *H03F 2203/45244* (2013.01); *H03F 2203/45248* (2013.01)

(58) Field of Classification Search
CPC ........................................................ H03F 3/45
USPC .......................................... 330/261, 285, 296
See application file for complete search history.

(56) References Cited

U.S. PATENT DOCUMENTS

| | | | | |
|---|---|---|---|---|
| 5,892,376 A * | 4/1999 | Tabatabai et al. ................ 327/73 |
| 6,148,220 A * | 11/2000 | Sharp et al. .................... 455/572 |
| 6,285,692 B1 * | 9/2001 | Okayasu .................... 372/38.02 |
| 6,339,361 B1 * | 1/2002 | Khesbak et al. ............... 330/285 |
| 6,465,994 B1 * | 10/2002 | Xi .................................. 323/274 |
| 6,614,300 B2 * | 9/2003 | Mages .......................... 330/133 |
| 6,985,036 B2 * | 1/2006 | Bhattacharjee et al. ...... 330/254 |
| 7,193,459 B1 * | 3/2007 | Epperson et al. ............. 330/130 |
| 7,561,089 B2 | 7/2009 | Zare-Hoseini |
| 7,808,318 B2 * | 10/2010 | Sohn et al. .................... 330/253 |
| 2005/0093630 A1 * | 5/2005 | Whittaker et al. ............. 330/254 |
| 2009/0295486 A1 | 12/2009 | Lee |

FOREIGN PATENT DOCUMENTS

| | | |
|---|---|---|
| CN | 1848018 A | 10/2006 |
| TW | 503613 | 9/2002 |
| TW | 200701634 | 1/2007 |

* cited by examiner

*Primary Examiner* — Henry Choe
(74) *Attorney, Agent, or Firm* — Winston Hsu; Scott Margo (57) ABSTRACT

An adaptive amplification circuit is provided, which includes an operational amplifier comprising a variable bias current source for providing a variable bias current for the operational amplifier, an equivalent circuit of the operational amplifier for receiving an input voltage and generating an output voltage according to the input voltage, and a bias control unit for generating a bias control signal to the variable bias current source according to the output voltage so as to adjust the variable bias current.

20 Claims, 7 Drawing Sheets

ADAPTIVE AMPLIFICATION CIRCUIT

CROSS REFERENCE TO RELATED APPLICATIONS

This is a continuation application of U.S. patent application Ser. No. 13/196,873, which was filed on Aug. 2, 2011 and entitled "ADAPTIVE AMPLIFICATION CIRCUIT", which is included in its entirety herein by reference.

BACKGROUND OF THE INVENTION

1. Field of the Invention

The present invention relates to an amplification circuit, and more particularly, to an amplification circuit capable of adaptively controlling bias current.

2. Description of the Prior Art

An operational amplifier is widely used for realizing a variety of circuit functions. Take driving circuits of a liquid crystal display (LCD) for example, the operational amplifier can be used as an output buffer, which charges or discharges loading ends, i.e. liquid crystals, according to analog signals outputted by a front stage digital-to-analog converter (DAC), for driving corresponding pixel units on the LCD. However, with increases in sizes and resolutions of LCDs, the amount of data processed by the driving circuits per unit of time is also increasing significantly, so that response speed of the operational amplifier, also called slew rate, has to be enhanced as well.

The operational amplifier generally has a three-stage structure, which includes an input stage circuit, again stage circuit, and an output stage circuit. The input stage circuit is utilized for increasing input impedance of the operational amplifier, the gain stage circuit is utilized for increasing current or voltage gain of the operational amplifier, and the output stage circuit is utilized for driving capacitive or resistive loads connected to the operational amplifier. In addition, since the operational amplifier may suffer loop instability problems, Miller compensation capacitors are commonly implemented to perform frequency compensation for improving loop stability. Moreover, for driving external loads connected to the operational amplifier, the drive current of the output stage circuit is generally greater than bias current of the input stage circuit. In this case, when the operational amplifier drives a heavy load, the slew rate is often restricted by the bias current of the input stage circuit.

In general, the response speed (slew rate) of the operational amplifier is decided by the bias current of the input stage circuit and the driving capability of the output stage circuit. In this situation, the response speed (slew rate) of the operational amplifier can be expressed by the following slew rate equation:

$$SR = \frac{I}{C} = \frac{\Delta V}{t},$$

in which "I" indicates a bias current, "C" indicates capacitance of the internal capacitors, and "ΔV" indicates voltage variation of the output voltage of the operational amplifier. This means that the response speed of the operational amplifier is decided by the charging (or discharging) speed when the internal capacitor of the operational amplifier is charged (or discharged) by the bias current of the input stage circuit. As can be seen from the above, when the bias current of the input stage circuit increases, the internal capacitors can be charged or discharged much faster, so the response speed of the operational amplifier can be enhanced as well. Therefore, in the prior art, the internal slew rate of the operational amplifier is generally enhanced by increasing the bias current of the input stage circuit so as to increase the driving speed of the operational amplifier.

Therefore, the prior art increases the bias current of the input stage circuit in a fixed period during operation of an operational amplifier to enhance the response speed of the operational amplifier. However, due to variations in pressure-volume-temperature (PVT) in actual application, an operational amplifier may have different enhancement effects of slew rate indifferent operating environments. Also, different operational amplifiers may have different enhancement effects of slew rate while operating in the same operating environment due to individual differences. In such situations, the method used by the prior art may introduce some problems.

For example, for an operation amplifier with a small internal capacitor, even after the internal capacitor has been sufficiently charged, the enhanced bias current continues to be provided to the operational amplifier, resulting in water of power consumed until a fixed period ends. This is disadvantageous to electric devices requiring low power consumption. Conversely, for an operation amplifier with a large internal capacitor, if the enhanced bias current is provided only for a fixed period, the internal capacitor cannot store enough electric charges within the fixed period, causing a bad enhancing effect of the slew rate and insufficient driving capability.

In view of above, the prior art blindly increases the bias current of the operational amplifier in a fixed period to enhance the slew rate without making appropriate adjustments to adapt to different operating environments and device requirements.

SUMMARY OF THE INVENTION

It is therefore an objective of the present invention to provide an adaptive amplification circuit which adaptively controls bias current to improve overall system performance and further obtain optimum system performance.

The present invention discloses an adaptive amplification circuit, comprising: an operational amplifier, comprising a variable bias current source for providing a variable bias current for the operational amplifier; an equivalent circuit of the operational amplifier, receiving an input voltage and generating an output voltage according to the input voltage; and a bias control unit for generating a bias control signal to the variable bias current source according to the output voltage so as to adjust the variable bias current.

The present invention further discloses an adaptive amplification circuit, comprising: a first operational amplifier, comprising a variable bias current source for providing a variable bias current for the operational amplifier; a second operational amplifier, having a circuit structure the same as that of the first operational amplifier, receiving an input voltage and generating an output voltage according to the input voltage; and a bias control unit for generating a bias control signal to the variable bias current source according to the output voltage so as to adjust the variable bias current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
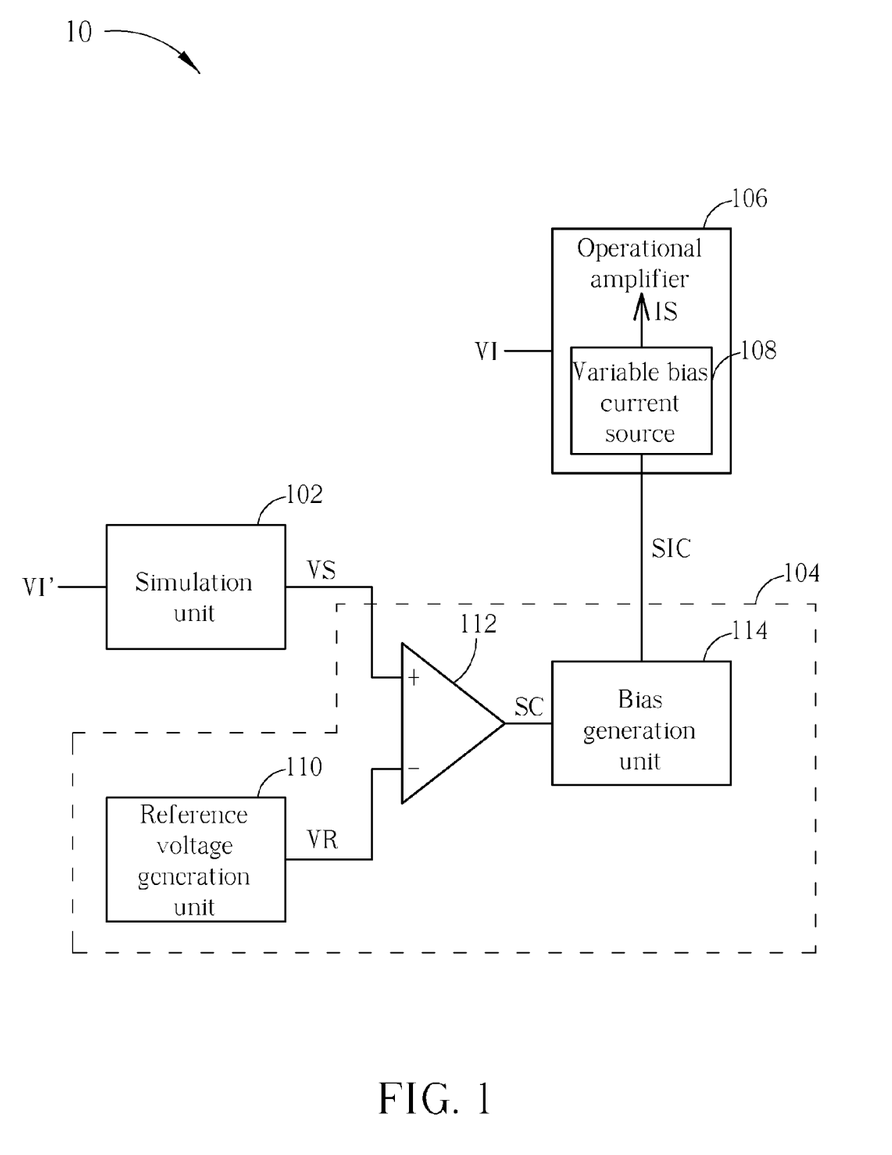
FIG. 1 is a schematic diagram of an amplification circuit according to an embodiment.

Please refer to FIG. 1, which is a schematic diagram of an amplification circuit 10 according to an embodiment. The amplification circuit 10 includes a simulation unit 102, a bias control unit 104, and an operational amplifier 106. The operational amplifier 106 includes a variable bias current source 108 for providing a variable bias current IS for each stage of the operational amplifier 106. Preferably, the variable bias current IS passes through at least an input stage of the operational amplifier 106. The operational amplifier 106 can be any kind of operational amplifier, such as a rail-to-rail amplifier, and this should not be a limitation of the invention. The simulation unit 102 and the bias control unit 104 can work in cooperation with each other so as to flexibly offer the variable bias current source 108 a better bias or an optimized bias corresponding to type and operating environment of the operational amplifier 106.

Generally speaking, the simulation unit 102 can be a model circuit or an equivalent circuit of the operational amplifier 106, capable of simulating operational characteristics of the operational amplifier 106. The simulation unit 102 is able to receive a simulation input voltage VI' and transform the simulation input voltage VI' into a simulation output voltage VS. Preferably, the simulation unit 102 can simulate at least one of a charging characteristic and a discharging characteristic of the operational amplifier 106 so that the simulation output voltage VS reflects a charging operational state or a discharging operational state of the operational amplifier 106.

The bias control unit 104 is configured to receive the simulation output voltage VS and generate a bias control signal SIC to the variable bias current source 108 accordingly for adjusting the variable bias current IS. Preferably, the bias control unit 104 can determine the bias control signal SIC according to both the simulation output voltage VS and a reference voltage VR. Voltage level of the reference voltage VR is determined according to the operating environment of the operational amplifier 106. For example, the reference voltage VR is determined according to one or multiple voltage terminals of a loading device (not shown) driven by the operational amplifier 106. Since the voltage level of the simulation output voltage VS and a reference voltage VR can reflect electrical characteristics of the operational amplifier 106 and its operating environment respectively, the bias control unit 104 would adjust the bias current provided for the operational amplifier 106 according to the operation of the operational amplifier 106 responsive to its operating environment.

Note that, the simulation input voltage VI' is preferably equal to the input voltage VI of the operational amplifier 106, and this is not a limitation of the invention. Different configurations of simulation unit 102 and bias control unit 104 would be able to operate with different levels of simulation input voltage VI', as long as the simulation unit 102 is able to transform the simulation input voltage VI' into the simulation output voltage VS appropriate for simulating the electrical characteristics of the operational amplifier 106.

FIG. 1 further illustrates a detailed structure of the bias control unit 104 according to a preferred embodiment. In the exemplary embodiment, the bias control unit 104 is configured to compare the simulation output voltage VS with a reference voltage VR and generate the bias control signal SIC according to the comparison result. As shown in FIG. 1, the bias control unit 104 includes a reference voltage generation unit 110, a comparator 112, and a bias generation unit 114.

The reference voltage generation unit 110 is utilized for generating a reference voltage VR, which, preferably, reflects the operating environment of the amplification circuit 10. For example, the reference voltage VR can be set at a desired level of an output voltage of the operational amplifier 106, or the reference voltage VR can be set according to the application environment of the amplification circuit 10. In other words, the voltage level of the reference voltage VR can often be determined according to any single or multiple voltage terminals of a loading device (not shown) driven by the operational amplifier 106, such as power voltage terminal or any system application voltage terminal.

The comparator 112 is utilized for comparing the simulation output voltage VS with the reference voltage VR to generate a comparison signal SC. For example, as shown in FIG. 1, the comparator 112 includes a first input for receiving the simulation output voltage VS, a second input for receiving the reference voltage VR, and a first output for outputting the comparison signal SC. The bias generation unit 114 is utilized for generating a bias control signal SIC to the variable bias current source 108 according to the comparison signal SC so that the variable bias current IS can be adjusted accordingly.

In a preferred embodiment, when the simulation output voltage VS is lower than the reference voltage VR, the bias generation unit 114 generates the corresponding bias control signal SIC to increase the variable bias current IS according to the comparison signal SC. On the other hand, when the simulation output voltage VS is higher than the reference voltage VR, the bias generation unit 114 generates the corresponding bias control signal SIC to decrease the variable bias current IS according to the comparison signal SC. As a result, the bias generation unit 114 is capable of exactly increasing the variable bias current IS when the response speed of the operational amplifier 106 needs to be enhanced. Moreover, the bias generation unit 114 can also decrease the variable bias current IS opportunely when the response speed of the operational amplifier 106 does not need to be enhanced anymore so as to avoid unnecessary power consumption of current. Note that the above-mentioned method is merely a preferred embodiment, and this should not be a limitation of the present invention. The bias generation unit 114 can be realized by any design method to appropriately adjust the variable bias current IS according to the comparison signal SC. Moreover, the variable bias current IS can be adjusted continuously or stage by stage. In other words, any design method is suitable for realizing the bias generation unit 114 as long as it is able to control the variable bias current source 108 to provide the appropriate variable bias current IS.

As can been seen, in the amplification circuit 10, the simulation unit 102 can generate the simulation output voltage VS to the comparator 112, and the bias generation unit 114 can then control the variable bias current IS provided to the operational amplifier 106 according to the comparison result generated by the comparator 112. Therefore, the amplification circuit 10 can suitably control the bias current for the operational amplifier 106 according to the type and the operating environment of the operational amplifier 106.

The prior art blindly increases the bias current of the operational amplifier in a fixed period to enhance the slew rate, causing insufficient driving capability or excessive power consumption. Comparatively, the embodiment shown in FIG.

1 can simulate the corresponding charging or discharging characteristics of the operational amplifier 106 under different applications to appropriately adjust the bias current of the operational amplifier 106 in adaptation to various operating situations. Accordingly, the embodiment can enhance the slow rate while solving problems such as insufficient driving capability or excessive power consumption.

Note that the detailed structure of the bias control unit 104 as shown in FIG. 1 is merely an embodiment, and this should not a limitation of the present invention. In another exemplary embodiment, the bias control signal SIC can also be generated by different circuit structure according to the simulation output voltage VS and a reference voltage VR.

Figure 2A:
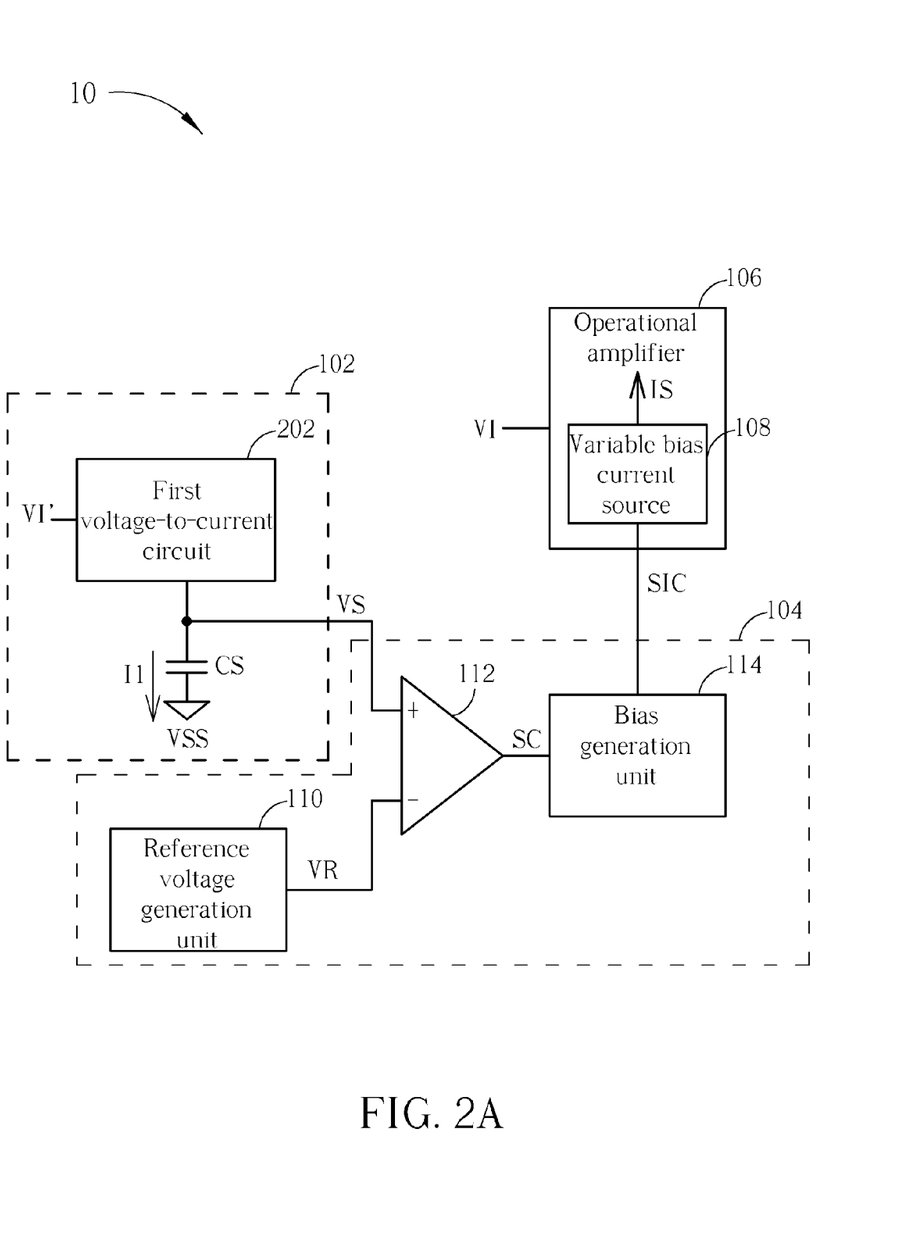
FIGS. 2A and 2B are respectively schematic diagrams of the simulation unit shown in FIG. 1 according to an embodiment.
Figure 3A:
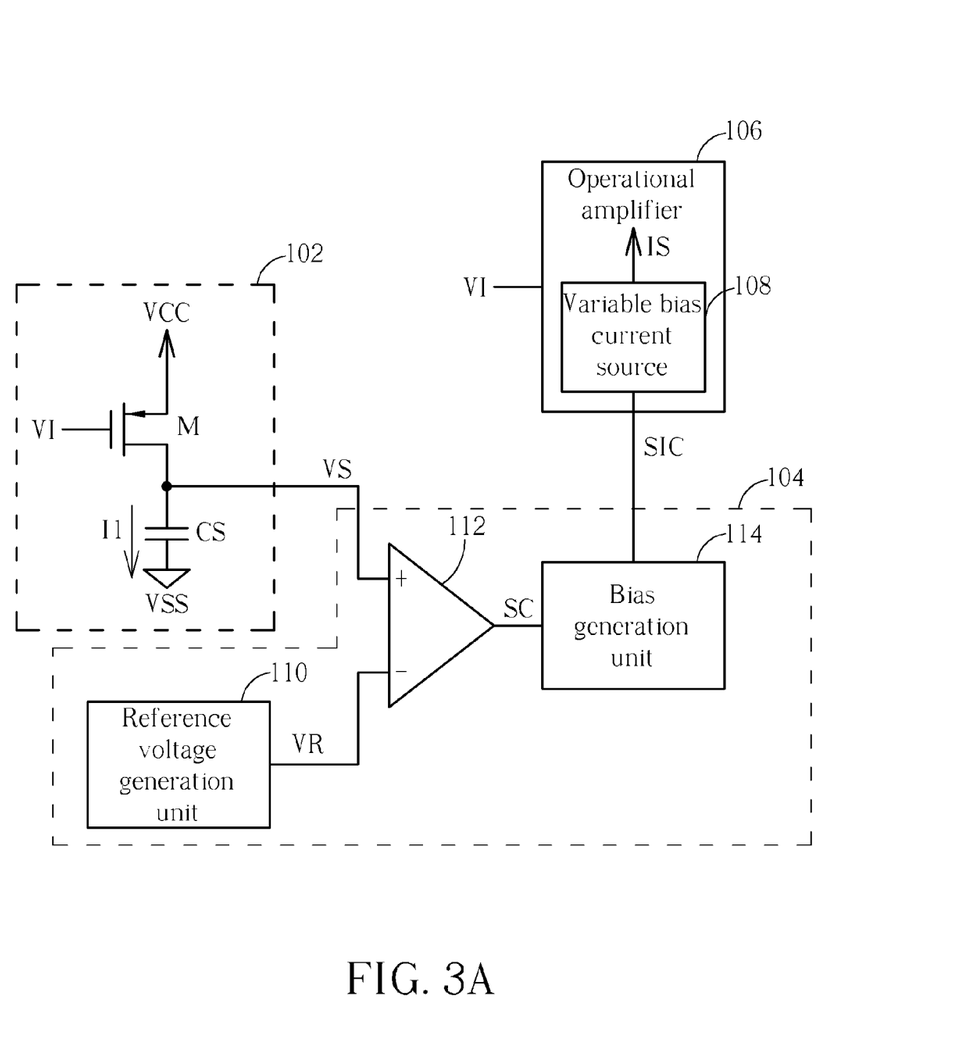
FIGS. 3A and 3B are respectively schematic diagrams of the first voltage-to-current circuit shown in FIGS. 2A and 2B according to an embodiment.

Furthermore, please refer to FIG. 2A, which is a schematic diagram of the simulation unit 102 shown in FIG. 1 according to an embodiment. The simulation unit 102 is utilized for simulating charging characteristics of the operational amplifier 106. The simulation unit 102 includes a first voltage-to-current circuit 202 and a simulation capacitor CS. The first voltage-to-current circuit 202 is utilized for transforming the simulation input voltage VI' to a first current I1. For example, please refer to FIG. 3A, which is a schematic diagram of the first voltage-to-current circuit 202 shown in FIG. 2A according to an embodiment of the present invention. As shown in FIG. 3A, the first voltage-to-current circuit 202 can be realized by a transistor M, such as a p-type metal oxide semiconductor (MOS) transistor, having a drain coupled to a power end VCC and a source coupled to the simulation capacitor CS. In this situation, the first current I1 can charge the simulation capacitor CS when the simulation input voltage VI' is provided to bias the gate of the transistor M. Please further refer to FIG. 2A. The simulation capacitor CS includes a first end coupled to the first voltage-to-current circuit 202 and the comparator 112, and a second end coupled to a reference voltage terminal VSS. The simulation capacitor CS can be charged by the first current I1, and the simulation output voltage VS is generated on the first input of the comparator 112 accordingly. In other words, during the simulation capacitor CS is charged by the first current I1, voltage level of the simulation output voltage VS may increase progressively until the simulation capacitor CS is saturated.

In the simulation unit 102, the capacitance value of the simulation capacitor CS is preferably equal to an equivalent capacitance value of an internal capacitor of the operational amplifier 106. In such a situation, if both of the simulation unit 102 and the operational amplifier 106 operate with the same bias, the charging operation by the first current I1 on the simulation capacitor CS would be equal to related charging operation of the operational amplifier 106. This means the operation of the simulation unit 102 can be regarded as a simulation operation of the operational amplifier 106 during the charging time of its internal capacitor. Therefore, the operation of the simulation unit 102 can be regarded as a basis to evaluate the internal charging state of the operational amplifier 106.

Note that, in another exemplary embodiment, the capacitance value of the simulation capacitor CS can be further considered to involve load capacitance values or other external capacitance values. Moreover, the capacitance value of the simulation capacitor CS can be any capacitance value, as long as the capacitance value can be used to simulate the charging and/or discharging characteristics of the operational amplifier 106.

The following further elaborates the operation of the amplification circuit 10 with the exemplary structure of the simulation unit 102 shown in FIGS. 2A and 3A. During actual operation, the voltage level of the simulation output voltage VS may increase progressively when the simulation capacitor CS is charged by the first current I1. During the gradual increasing of the level of the simulation output voltage Vs, if the simulation output voltage VS is lower than the reference voltage VR, the bias generation unit 114 generates the corresponding bias control signal SIC to the variable bias current source 108 according to the comparison signal SC so that the variable bias current IS provided to the operational amplifier 106 increases accordingly. On the other hand, when the simulation output voltage VS is higher than the reference voltage VR, the bias generation unit 114 generates the corresponding bias control signal SIC to the variable bias current source 108 according to the comparison signal SC so that the variable bias current IS provided to the operational amplifier 106 decreases accordingly. In other words, the operating response of the operational amplifier 106 can be simulated and monitored through the operation of the simulation unit 102. Moreover, through the operation of the comparator 112, the bias current may be controlled dynamically and accurately according to status of the operational amplifier 106.

Figure 2B:
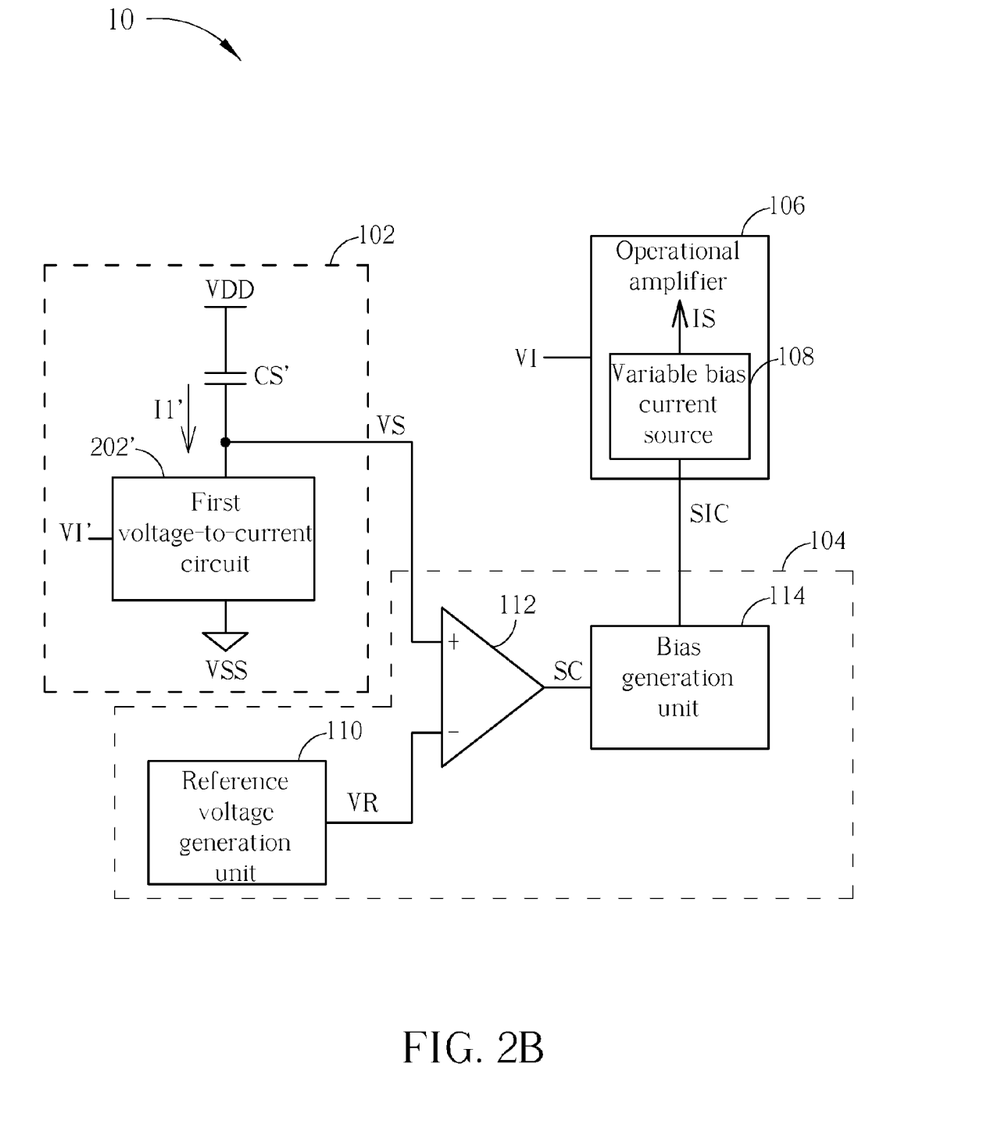
Figure 3B:
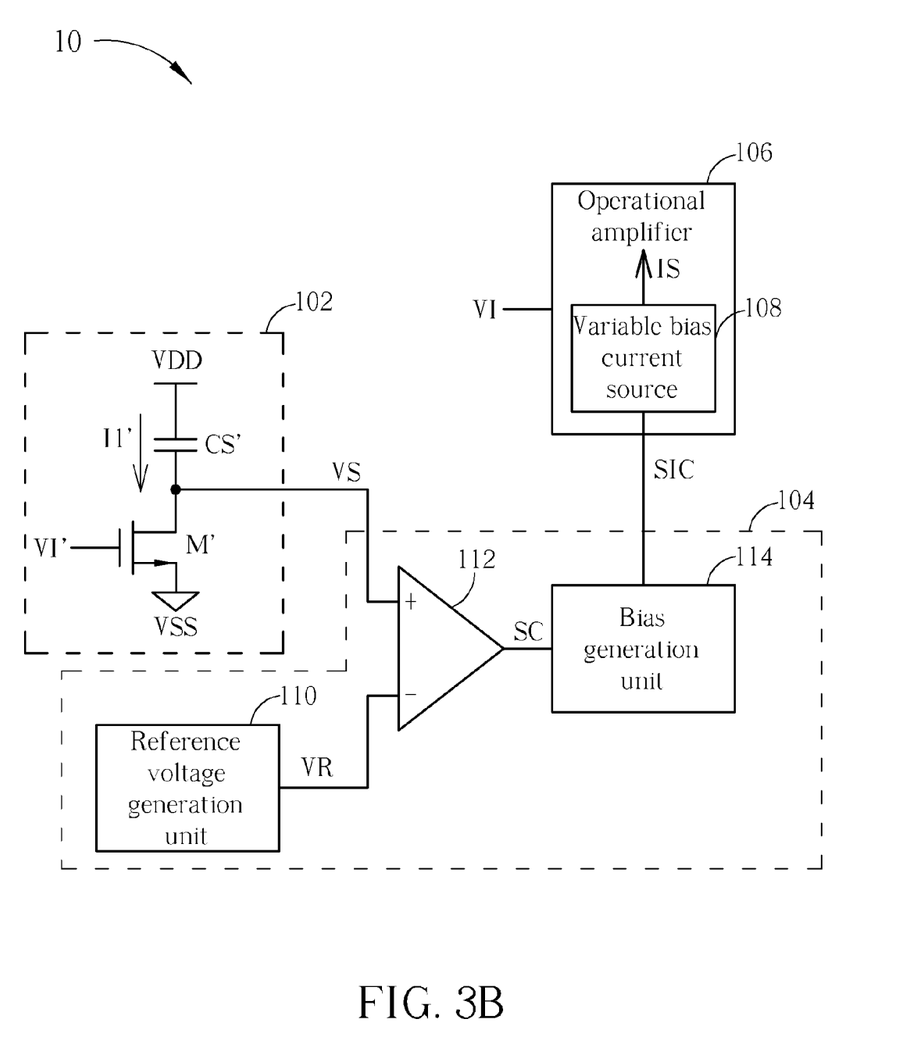

Note that, the exemplary embodiment shown in FIGS. 2A and 3A illustrates that the simulation unit 102 simulates the charging characteristics of the operational amplifier 106. However, the simulation unit 102 can also simulate the discharging characteristics of the operational amplifier 106 by referring to the above operations. For example, please refer to FIGS. 2B and 3B, the simulation unit 102 simulates the discharging characteristics of the operational amplifier 106. Similarly, the simulation unit 102 includes a first voltage-to-current circuit 202' and a simulation capacitor CS'. The first voltage-to-current circuit 202' is utilized for transforming the simulation input voltage VI' to a first current I1'. For example, as shown in FIG. 3B, the first voltage-to-current circuit 202' can be realized by a transistor M', such as an NMOS transistor. The simulation capacitor CS' is coupled between the first voltage-to-current circuit 202' and a reference voltage terminal VDD, and charged by the first current I1'. The simulation output voltage VS is generated accordingly. More other details can be analogized from the foregoing description, so as not to be narrated herein.

In addition, the simulation unit 102 illustrated in FIGS. 2A to 3B is realized with a voltage-to-current circuit and a simulation capacitor, and this should not be limitation of the present invention. In another exemplary embodiment, the simulation unit 102 can be a physical circuit identical or similar to the operational amplifier 106. The simulation unit 102 also can be an equivalent circuit having charging/discharging characteristics identical to those of the operational amplifier 106. Besides, the simulation unit 102 can further include a loading capacitor or other external capacitors. Moreover, the simulation unit 102 can be any kind of circuit which can simulate a charging and/or discharging state of the operational amplifier 106. In brief, any kind of circuit capable of simulating the electrical characteristics, such as charging and/or discharging of the operational amplifier 106 can be used to realize the simulation unit 102. The first voltage-to-current circuits 202 and 202' shown in FIGS. 2A and 2B can be realized by transistors shown in FIGS. 3A and 3B. The first voltage-to-current circuits 202 and 202' can also be realized with other transistor combinations, any kind of bias current source, or any apparatus having voltage-to-current transformation function.

Figure 4:
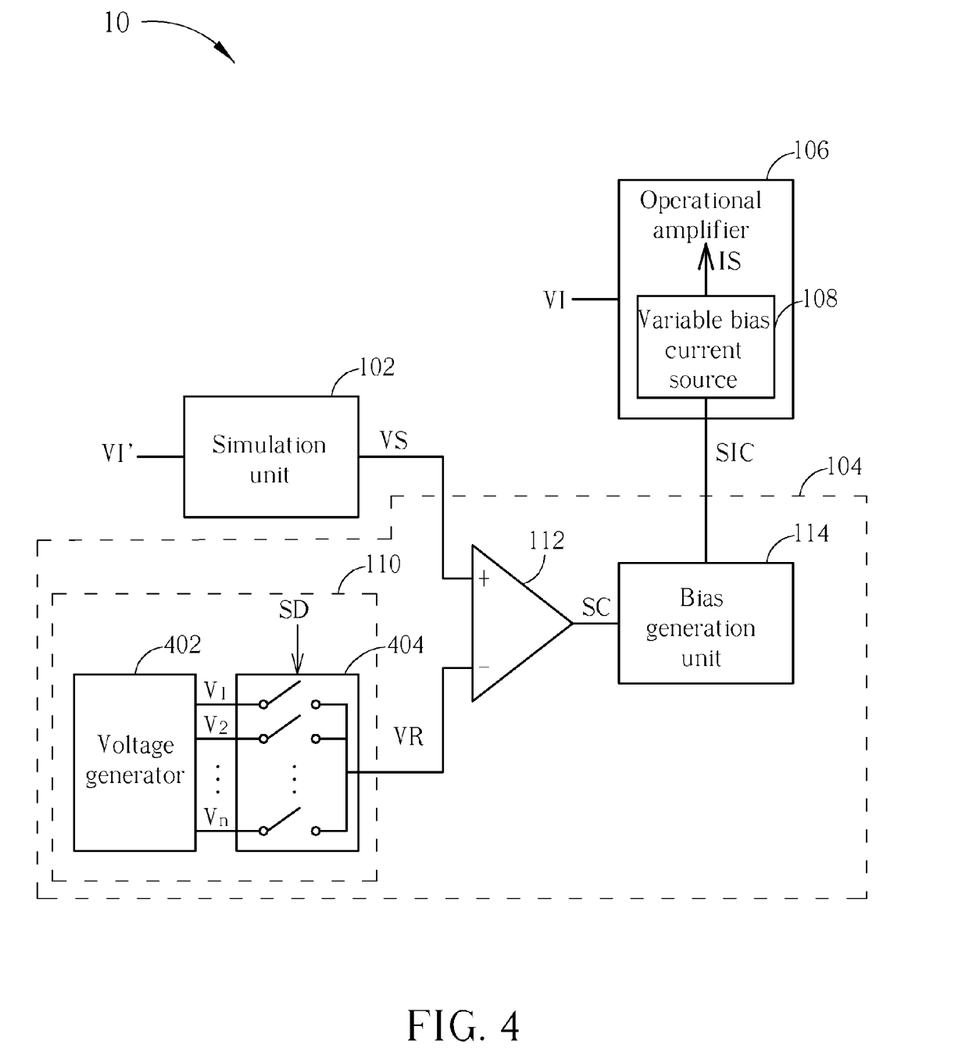
FIG. 4 is a schematic diagram of the reference voltage generation unit shown in FIG. 1 according to an embodiment.

Please refer to FIG. 4, which is a schematic diagram of the reference voltage generation unit 110 shown in FIG. 1 according to an embodiment. The reference voltage generation unit 110 can adjust the voltage level of the reference voltage VR according to a data comparison signal SD. As shown in FIG.

4, the reference voltage generation unit 110 includes a voltage generator 402 and a multiplexer 404. The voltage generator 402 is utilized for generating predefined reference voltages V1 to Vn (n is a positive integer). The multiplexer 404 is utilized for selecting the reference voltage VR from the predefined reference voltages V1 to Vn according to a data comparison signal SD for provision to the comparator 112.

The voltage levels of the predefined reference voltages V1 to Vn depend on the operating environment of the amplification circuit 10. For example, the reference voltage VR depends on single or multiple voltage terminals of a loading device driven by the operational amplifier 106. Taking the amplification circuit 10 applied in a liquid crystal display (LCD) for example, each of the predefined reference voltages V1 to Vn can be a gamma voltage corresponding to a specific gray level of the LCD. The gray level displayed by each pixel corresponds to the gray level of the image data. In such a situation, for each pixel, the data comparison signal SD can be the data control signal outputted by a timing controller of the LCD. Therefore, the multiplexer 404 is able to select a corresponding predefined reference voltage as the reference voltage VR, and voltage level of the selected predefined reference voltage is equal to the gamma voltage value of the gray level displayed by the pixel.

In addition, the reference voltage VR can be adjusted according to various design methods to achieve a rough or fine adjustment for the driving capacity of the operational amplifier 106. In an exemplary embodiment of achieving a rough adjustment, since gamma voltages for different LCDs may have a specific usage range, each selected reference voltage can be provided for the same LCD. In an exemplary embodiment of achieving a fine adjustment, gamma voltage values of pixels on the same display panel may change dynamically so that various reference voltages can be selected dynamically and instantaneously for the same LCD. Therefore, the reference voltage generation unit 110 is capable of generating an appropriate the reference voltage VR.

Note that, the circuit structure shown in FIG. 4 is merely an exemplary embodiment. The reference voltage generation unit 110 can be realized by any other circuit structure. Usually, the reference voltage generation unit 110 can adjust the reference voltage VR according to relevant voltage terminals of a loading device driven by the operational amplifier 106.

Figure 5:
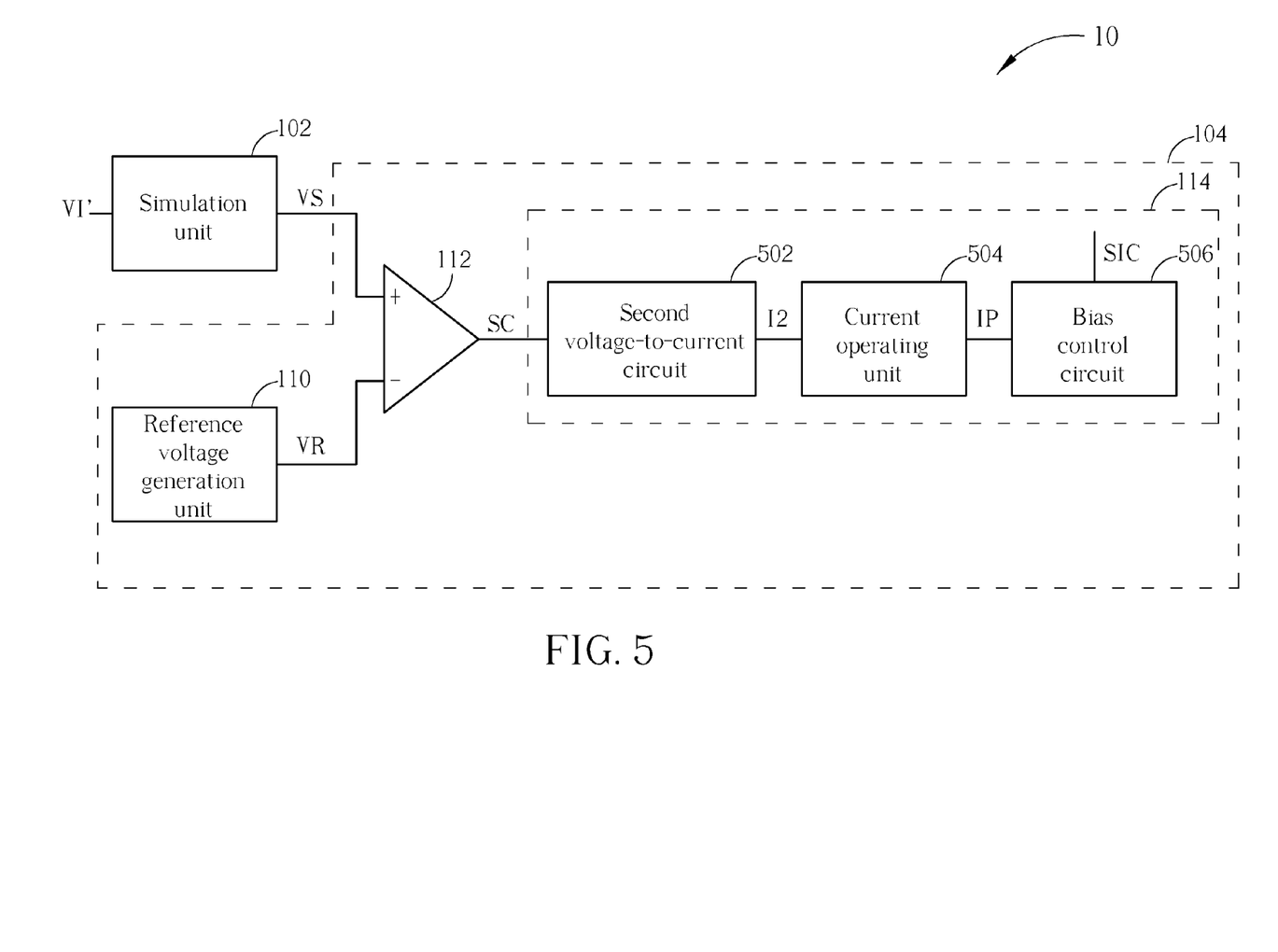
FIG. 5 is a schematic diagram of the bias generation unit shown in FIG. 1 according to an embodiment.

Please refer to FIG. 5, which is a schematic diagram of the bias generation unit 114 shown in FIG. 1 according to an embodiment. The bias generation unit 114 includes a second voltage-to-current circuit 502, a current operating unit 504, and a bias control circuit 506. The second voltage-to-current circuit 502 is utilized for transforming the comparison signal SC to a second current I2. The second voltage-to-current circuit 502 can be realized with a bias current source composed of one or more transistors, any other kind of bias current source, or any device capable of transforming a voltage signal into a current signal. The current operating unit 504 is utilized for generating an operating current IP according to the second current I2. Preferably, the current operating unit 504 can be a current mirror circuit able to perform mirroring, adding (with or without weighting), subtracting, combining, or other current operations on the second current I2, and this should not be a limitation of the present invention. The bias control circuit 506 is utilized for generating the bias control signal SIC according to the operating current IP.

Under above configuration, when the simulation output voltage VS is lower than the reference voltage VR, the second voltage-to-current circuit 502 transforms the comparison signal SC in voltage form into a second current I2. After that, the current operating unit 504 generates the operating current IP according to the second current I2. The bias control circuit 506 then generates the bias control signal SIC according to the operating current IP for increasing the variable bias current IS. Similarly, when the simulation output voltage VS is higher than the reference voltage VR, the bias control circuit 506 generates the bias control signal SIC according to the operating current IP for decreasing the variable bias current IS.

Note that, the circuit structure shown in FIG. 4 is merely an exemplary embodiment, and not a limitation of the invention. For example, in another exemplary embodiment, the bias control circuit 506 can be part of the variable bias current source 108, which means that the bias control circuit 506 can be realized by the variable bias current source 108. For example, if the current operating unit 504 is a current mirror circuit coupled to the variable bias current source 108, that is, the current operating unit 504 and the variable bias current source 108 have a current mirror relationship, then the operating current IP can be copied to the variable bias current source 108 to vary the variable bias current IS. In another exemplary embodiment, the bias generation unit 114 can be realized by any kind of circuit, as long as it is able to generate the bias control signal SIC for controlling the variable bias current source 108 according to the comparison signal SC generated by the comparator 112.

In summary, the operation of the simulation unit 102 can be regarded as a basis to evaluate the internal charging or discharging state of the operational amplifier 106 so that the bias current provided to the operational amplifier 106 can be fine-adjusted according to the type of the operational amplifier 106 and the variation in the operating environment. In other words, above-mentioned embodiments can adapt to the application environment to adjust the supply of the bias current of the operational amplifier 106, thus achieving enhancement of slew rate without consuming excessive power while solving the problem of insufficient driving ability and achieving improved or optimum system performance.

Those skilled in the art will readily observe that numerous modifications and alterations of the device and method may be made while retaining the teachings of the invention.

What is claimed is:

1. An adaptive amplification circuit, comprising:
   an operational amplifier, comprising a variable bias current source for providing a variable bias current for the operational amplifier;
   an equivalent circuit of the operational amplifier, receiving an input voltage and generating an output voltage according to the input voltage, the equivalent circuit comprising:
   a first voltage-to-current circuit for transforming the input voltage to a first current; and
   a simulation capacitor coupled between the first voltage-to-current circuit and a reference voltage terminal for generating the output voltage; and
   a bias control unit for generating a bias control signal to the variable bias current source according to the output voltage so as to adjust the variable bias current.

2. The adaptive amplification circuit of claim 1, wherein the bias control unit comprises:
   a reference voltage generation unit for generating a reference voltage;
   a comparator for comparing the output voltage with the reference voltage to generate a comparison signal; and
   a bias generation unit for generating the bias control signal to the variable bias current source according to the comparison signal so as to adjust the variable bias current.

3. The adaptive amplification circuit of claim 2, wherein the reference voltage generation unit generates the reference voltage at various voltage levels according to a data comparison signal.

4. The adaptive amplification circuit of claim 2, wherein the reference voltage generation unit comprises:
   a voltage generator for generating a plurality of predefined reference voltages; and
   a multiplexer for selecting the reference voltage from the plurality of predefined reference voltages according to a data comparison signal.

5. The adaptive amplification circuit of claim 2, wherein the bias generation unit comprises:
   a second voltage-to-current circuit for transforming the comparison signal to a second current;
   a current operating unit for generating an operating current according to the second current; and
   a bias control circuit for generating the bias control signal according to the operating current.

6. The adaptive amplification circuit of claim 2, wherein the bias generation unit comprises:
   a second voltage-to-current circuit for transforming the comparison signal to a second current; and
   a current operating unit for generating an operating current and the bias control signal according to the second current.

7. The adaptive amplification circuit of claim 1, wherein the equivalent circuit simulates operational characteristics of the operational amplifier.

8. The adaptive amplification circuit of claim 7, wherein the operational characteristics of the operational amplifier comprises at least one of a charging characteristic and a discharging characteristic.

9. An adaptive amplification circuit, comprising:
   a first operational amplifier, comprising a variable bias current source for providing a variable bias current for the operational amplifier;
   a second operational amplifier, having a circuit structure the same as that of the first operational amplifier, receiving an input voltage and generating an output voltage according to the input voltage; and
   a bias control unit, comprising:
      a reference voltage generation unit for generating a reference voltage;
      a comparator for comparing the output voltage with the reference voltage to generate a comparison signal; and
      a bias generation unit for generating a bias control signal to the variable bias current source according to the comparison signal so as to adjust the variable bias current.

10. The adaptive amplification circuit of claim 9, wherein the reference voltage generation unit generates the reference voltage at various voltage levels according to a data comparison signal.

11. The adaptive amplification circuit of claim 9, wherein the reference voltage generation unit comprises:
   a voltage generator for generating a plurality of predefined reference voltages; and
   a multiplexer for selecting the reference voltage from the plurality of predefined reference voltages according to a data comparison signal.

12. The adaptive amplification circuit of claim 9, wherein the bias generation unit comprises:
   a second voltage-to-current circuit for transforming the comparison signal to a second current;
   a current operating unit for generating an operating current according to the second current; and
   a bias control circuit for generating the bias control signal according to the operating current.

13. The adaptive amplification circuit of claim 9, wherein the bias generation unit comprises:
   a second voltage-to-current circuit for transforming the comparison signal to a second current; and
   a current operating unit for generating an operating current and the bias control signal according to the second current.

14. The adaptive amplification circuit of claim 9, wherein the second operational amplifier simulates at least one of a charging characteristic and a discharging characteristic of the first operational amplifier.

15. An adaptive amplification circuit, comprising:
   an operational amplifier, comprising a variable bias current source for providing a variable bias current for the operational amplifier;
   a voltage converting circuit, receiving an input voltage and generating an output voltage according to the input voltage; and
   a bias control unit for generating a bias control signal to the variable bias current source according to the output voltage of the voltage converting circuit so as to adjust the variable bias current, wherein the bias control unit comprises:
      a reference voltage generation unit for generating a reference voltage;
      a comparator for comparing the output voltage with the reference voltage to generate a comparison signal; and
      a bias generation unit for generating the bias control signal to the variable bias current source according to the comparison signal so as to adjust the variable bias current.

16. The adaptive amplification circuit of claim 15, wherein the reference voltage generation unit generates the reference voltage at various voltage levels according to a data comparison signal.

17. The adaptive amplification circuit of claim 15, wherein the reference voltage generation unit comprises:
   a voltage generator for generating a plurality of predefined reference voltages; and
   a multiplexer for selecting the reference voltage from the plurality of predefined reference voltages according to a data comparison signal.

18. The adaptive amplification circuit of claim 15, wherein the bias generation unit comprises:
   a second voltage-to-current circuit for transforming the comparison signal to a second current;
   a current operating unit for generating an operating current according to the second current; and
   a bias control circuit for generating the bias control signal according to the operating current.

19. The adaptive amplification circuit of claim 15, wherein the bias generation unit comprises:
   a second voltage-to-current circuit for transforming the comparison signal to a second current; and
   a current operating unit for generating an operating current and the bias control signal according to the second current.

20. An adaptive amplification circuit, comprising:
   an operational amplifier, comprising a variable bias current source for providing a variable bias current for the operational amplifier;

a voltage-to-current circuit for transforming an input voltage to a first current; and a capacitor coupled between the first voltage-to-current circuit and a reference voltage terminal for generating an output voltage according to the first current; and a bias control unit for generating a bias control signal to the variable bias current source according to the output voltage so as to adjust the variable bias current.

\* \* \* \* \*